(12) United States Patent
Hwang et al.

(10) Patent No.: US 7,699,657 B2
(45) Date of Patent: Apr. 20, 2010

(54) SIGNAL CONVERTING APPARATUS WITH A RELAY FUNCTION WIRE TERMINAL

(75) Inventors: Shih-Ming Hwang, 16842 Millikan Ave., Irvine, CA (US) 92606; Liang-Lun Hwang, Irvine, CA (US); Chien-Jong Hwang, Irvine, CA (US)

(73) Assignee: Shih-Ming Hwang, Irvine, CA (US)

( * ) Notice: Subject to any disclaimer, the term of this patent is extended or adjusted under 35 U.S.C. 154(b) by 203 days.

(21) Appl. No.: 11/987,155

(22) Filed: Nov. 28, 2007

(65) Prior Publication Data
US 2009/0134915 A1 May 28, 2009

(51) Int. Cl.
*H01R 9/11* (2006.01)
(52) U.S. Cl. .................................. 439/623; 439/505
(58) Field of Classification Search .......... 439/489, 439/490, 502, 505, 623, 620.21, 620.22, 439/801
See application file for complete search history.

(56) References Cited

U.S. PATENT DOCUMENTS 5,188,542 A * 2/1993 Ballman ............. 439/620.22
5,573,425 A * 11/1996 Morisawa et al. ........... 439/502
5,836,784 A * 11/1998 De Oliveira et al. ........ 439/502

* cited by examiner

*Primary Examiner*—Thanh-Tam T Le
(74) *Attorney, Agent, or Firm*—Bacon & Thomas, PLLC

(57) ABSTRACT

A signal converting apparatus with a relay function connector includes a body, a signal converting unit installed in the body and having a signal connecting portion connected to an electronic device for transmitting or receiving a first signal, and at least one first signal line is extended into the body and connected to the signal converting unit. The signal connecting portion is connected to another signal converting apparatus through the first signal line, and a relay function wire terminal is installed in the body and has an end connected to a second signal line. The second signal line is connected to the electronic device or an electric equipment for transmitting/receiving a second signal to/from the electronic device or electric equipment respectively. The relay function wire terminal is connected to a third signal line, and the third signal line is connected to an electric adapter of another signal converting apparatus.

4 Claims, 3 Drawing Sheets

SIGNAL CONVERTING APPARATUS WITH A RELAY FUNCTION WIRE TERMINAL

FIELD OF THE INVENTION

The present invention relates to a signal converting apparatus, and more particularly to a signal converting apparatus comprising a signal converting unit and a connector terminal with a relay function wire terminal, wherein two ends of the signal converting unit are connected to two different kinds of signal lines respectively (for example, coaxial cable and network line) for converting the incoming signal received into a different type of signal and then transmitting the new type of signal via the corresponding signal line, and two ends of the relay connector are connected to signal lines respectively for directly transmitting signals, such as data or power signals, so as to unify and group all the signal wires into a common location and achieve the effects of reducing the material cost and the wiring time related to cables, as well as providing a neat and organized wiring installation.

BACKGROUND OF THE INVENTION

In response to rising crime rates, monitors and surveillance systems are being installed in places like malls, elevators, and residential areas according to the conditions and requirements of the installed location to help maintain public order and protect life and property. The installation of such monitoring equipment can effectively eliminate blind spots of public security in areas lacking police patrols, leading to extensive acceptance and use of monitors and surveillance systems.

In general, existing video monitoring equipment are required to convert an analog image signal into a digital signal so that a video playing device connected to the monitoring equipment can play back the video images. In FIG. 1, an image transmitter can be installed on a connector 401 of a monitoring card 400 of a computer device 500, and the image transmitter has an enclosure box 100 wherein a connector 101 is disposed at an end of the enclosure box 100 and connected to the corresponding monitoring card 400, and the other end of the enclosure box 100 includes a plurality of signal lines 200. When the monitoring cards 400 are connected with a plurality of image transmitter enclosure boxes 100, each enclosure box 100 is connected independently to a single signal line, and a power cable 300 from each connector 401 is connected to an external power supply. Since the plurality of signal lines 200 at the end of the enclosure boxes 100 cannot be arranged together with the power cables 300, these signal lines 200 and power cables 300 makes the appearance of the computer device 500 look disorganized. If one of the enclosure boxes 100 breaks down, it is necessary to search for the damaged enclosure box 100 among these tangled signal lines 200 and power cables 300 in order to repair the damaged enclosure box 100, thus making the management and maintenance of the enclosure boxes 100 very inconvenient while making the overall appearance of the computer device 500 look disorganized. Furthermore, the computer device 500 is connected to a plurality of connectors 401 and a plurality of enclosure boxes 100, and thus the prior art has the additional following two drawbacks:

1. The power cables 300 and the enclosure boxes 100 have separate connecting lines, and the power cables 300 are connected line by line, and a poor contact or connection may occur easily when connecting the power cables 300 in this fashion.

2. When the monitoring cards 400 and the enclosure boxes 100 are connected, the quantity of power cables 300 and signal lines 200 expands and becomes difficult to manage, thus making the overall wiring appearance disorganized and the maintenance and management of the wiring inconvenient.

Obviously, finding a way to solve the aforementioned problems of the prior art while maintaining the original advantages of the monitoring equipment demands immediate attention and feasible solutions.

SUMMARY OF THE INVENTION

In view of the foregoing shortcomings of the prior art, the inventor of the present invention, based on years of experience in the related industry, has conducted extensive research and experiments, and finally developed a signal converting apparatus with a relay function wire terminal in accordance with the present invention to overcome the shortcomings of the prior art.

It is a primary objective of the present invention to provide a signal converting apparatus with a relay function wire terminal, and the apparatus comprises: a body; a signal converting unit and a relay function wire terminal installed in the body, with the signal converting unit installed proximate to the bottom of the body; a signal connector portion disposed at an end of the signal converting unit, and protruded and exposed from an end of the body, and connected to an electronic device through a signal line for transmitting or receiving a first signal; at least one first signal line disposed on the other end of the body and extended into the body, and connected to the signal converting unit, wherein the signal connecting portion is connected to another signal converting apparatus through the first signal line, and the relay function wire terminal is installed at a position of the body proximate to the top of the body. The relay function wire terminal comprises an electrically conducting board, a plurality of first and second conductive members, and a plurality of first and second locking elements, and each conductive member is installed on the electrically conducting board, and the locking elements are installed movably and respectively at the first and second conductive members such that the electrically conducting board, the conductive members, and the locking elements are electrically conducted with each other. In addition, the end of the relay function terminal has a connecting terminal to connect a second signal line, and the other end of the second signal line is connected to the electronic device or an electric equipment for transmitting and receiving a second signal to and from the electronic device or electric equipment, the other end of the relay function terminal is provided for connecting an end of a third signal line, and another end of the third signal line is connected to the electronic device, so that the signal converting unit can convert the first signal, and the first signal can be transmitted to the electronic device and another signal converting apparatus through the first signal line and a fourth signal line respectively. In the meantime, the second signal is transmitted to the electronic device, another signal converting apparatus, and the electric equipment through the second signal line and the third signal line so that the second signal line of the electronic device can be centralized at the body so as to save the material cost and the wiring time of the cables and maintain a neat and organized overall appearance.

To make it easier for our examiner to understand the objective, technical characteristics and effects of the present invention, preferred embodiments will be described with accompanying drawings as follows;

DETAILED DESCRIPTION OF THE PREFERRED EMBODIMENTS

Figure 1:
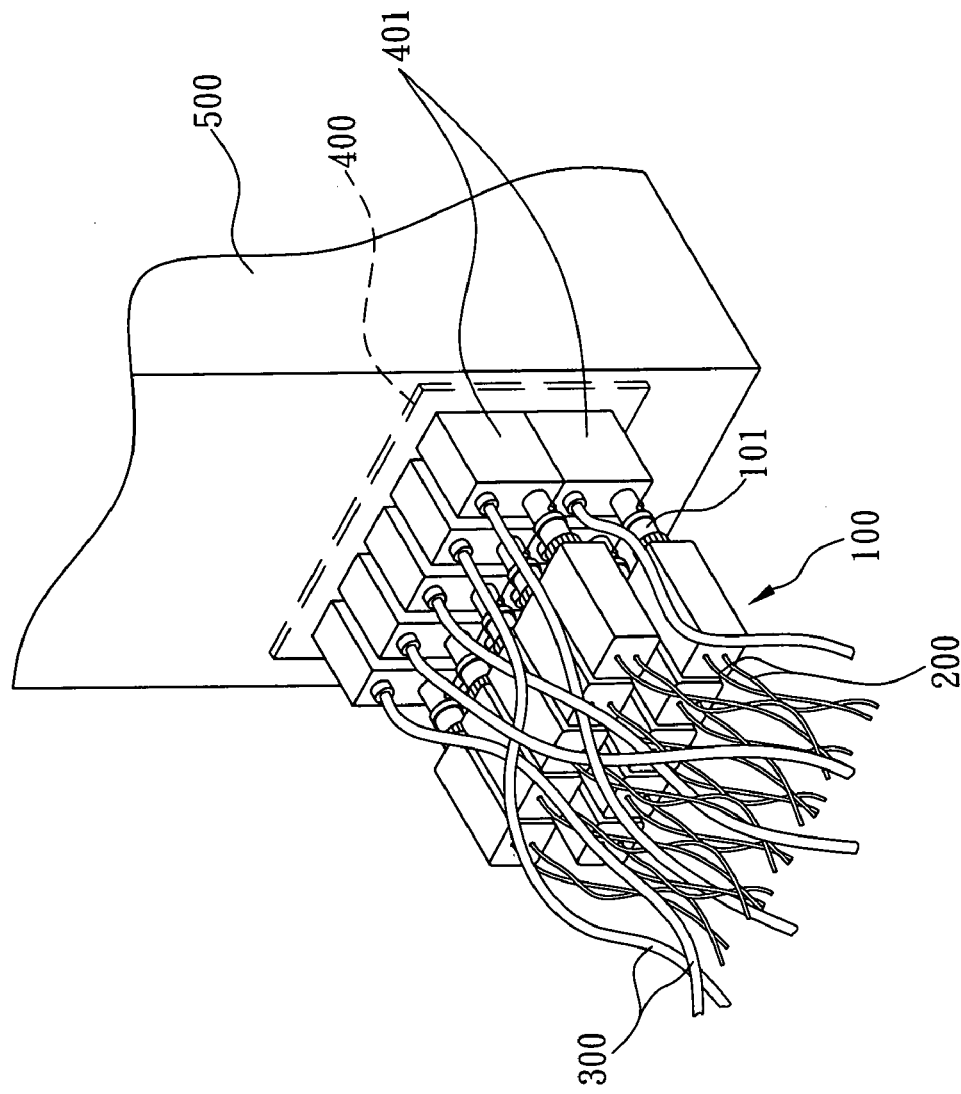
FIG. 1 is a schematic view of a conventional network apparatus.
Figure 2:
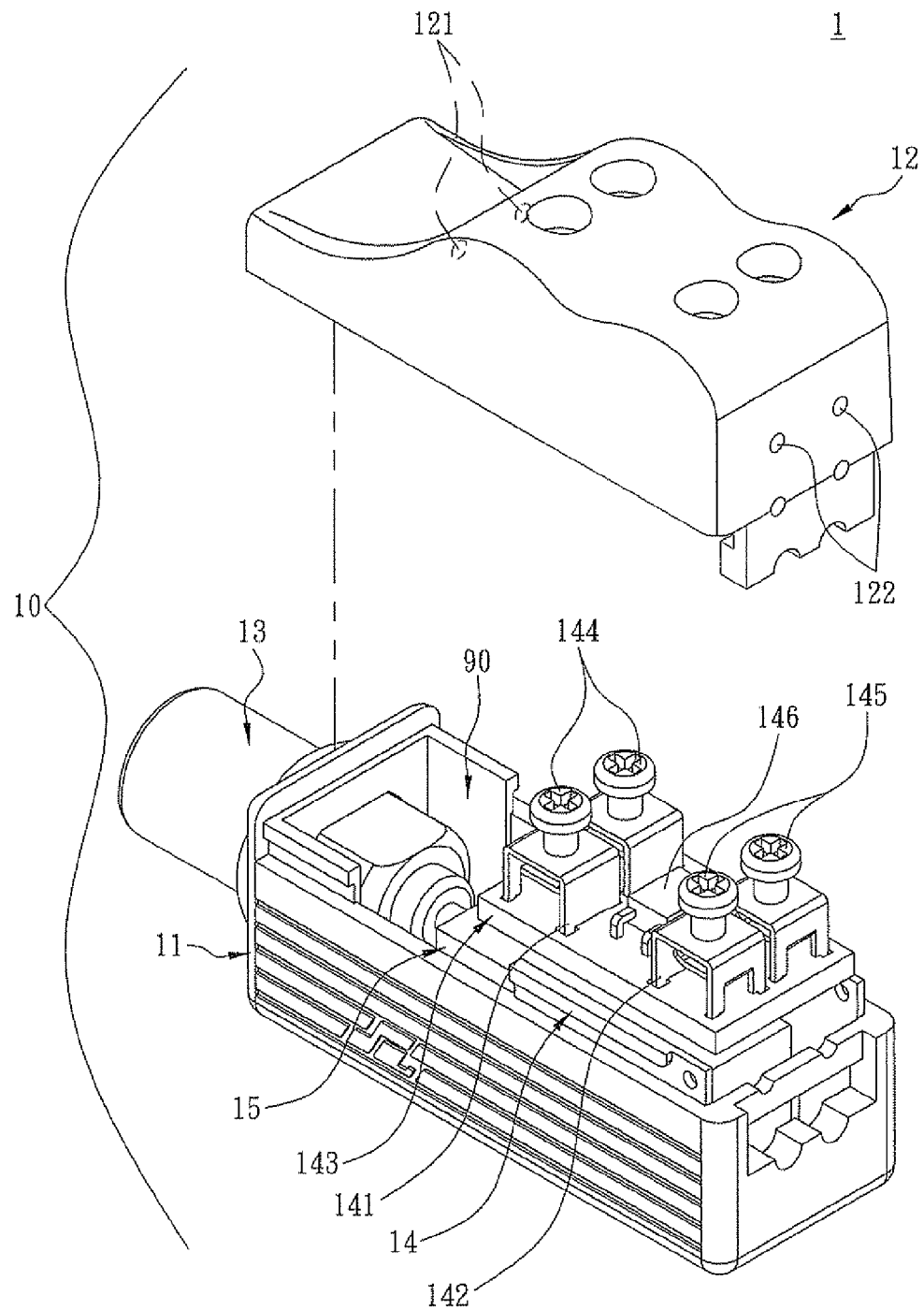
FIG. 2 is a perspective view of the present invention.
Figure 3:
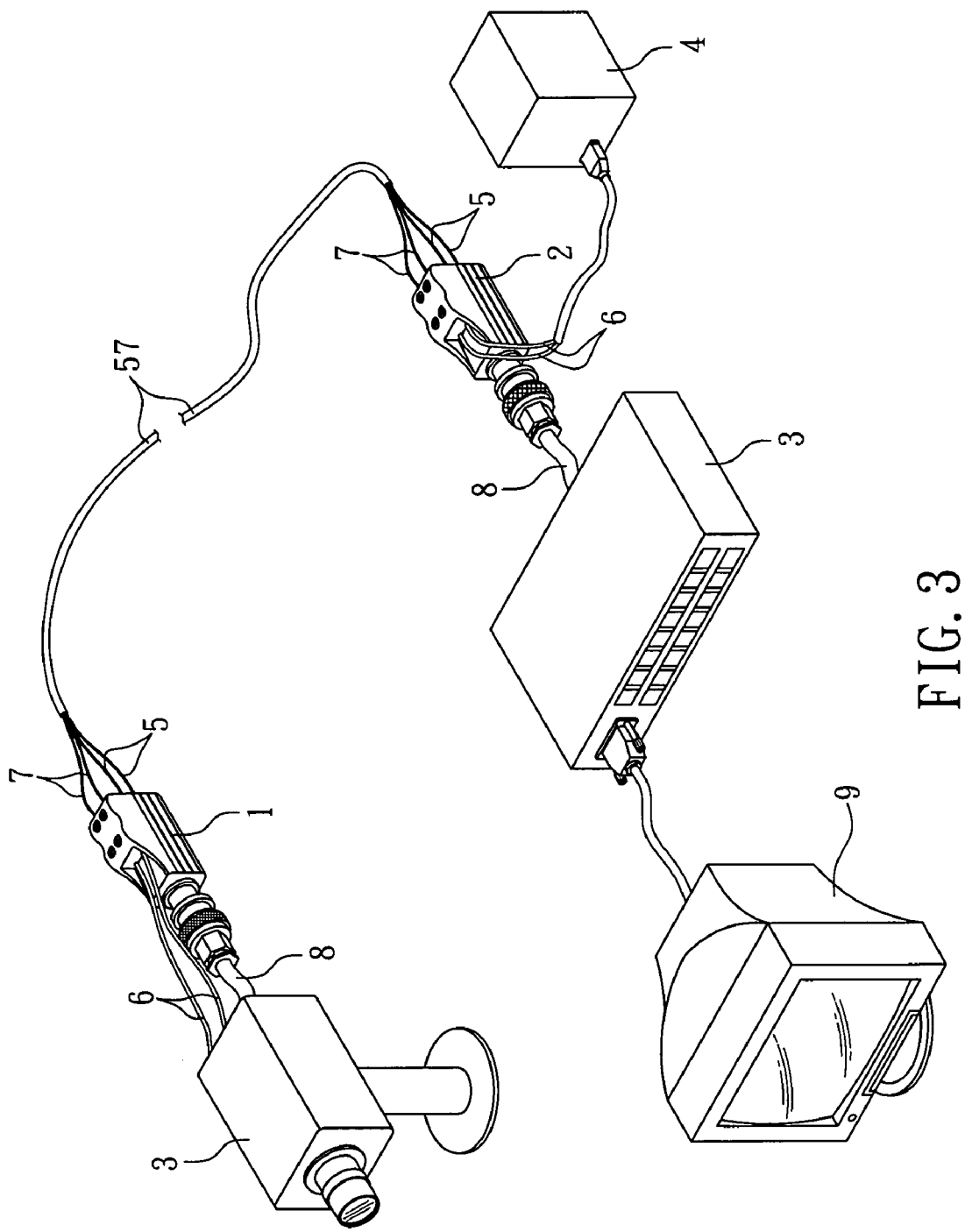
FIG. 3 is a schematic view of a preferred embodiment of the present invention.

Referring to FIGS. 2 and 3 for a signal converting apparatus with a relay function wire terminal in accordance with the present invention, the signal converting apparatus comprises: a body 10; a signal converting unit 15 and a relay function wire terminal 14 disposed in the body 10, wherein the signal converting unit 15 is installed in the body 10 proximate to the bottom of the body 10, and a signal connecting portion 13 (such as a BNC connector) is disposed at an end of the signal converting unit 15 and connected to an electronic device 3 (such as a camera, a CCD camera, or a digital video recorder) through a fourth signal line 8 for transmitting or receiving a first signal, and another end of the body 10 is provided for extending at least one first signal line 5 into the body 10 and connecting the first signal line 5 to the signal converting unit 15. The signal connecting portion 13 is connected to another signal converting apparatus 2 through the first signal line 5, and the relay function wire terminal 14 is installed in the body 10 and proximate to the top of the body 10, and an end of the relay function wire terminal 14 is connected to an end of a second signal line 6, and another end of the second signal line 6 is connected to the electronic device 3 or to an electric equipment 4 (such as a power supply or a power over Ethernet (PoE) device) for transmitting/receiving a second signal to/from the electronic device 3 or electric equipment 4, wherein the second signal is a power supply signal transmitted from the electric equipment 4.

In addition, another end of the relay function wire terminal 14 is provided for connecting an end of at least one third signal line 7, and another end of the third signal line 7 is connected to the corresponding end of the relay function wire terminal 14 of the other signal converting apparatus 2, so that the signal converting unit 15 can convert the first signal that can be transmitted to the electronic device 3 and another signal converting apparatus 2 through the first signal line 5 and a fourth signal line 8 respectively, while the second signal can be transmitted separately to the electronic device 3, another signal converting apparatus 2 and the electric equipment 4 through the second signal line 6 and the third signal line 7, such that the second signal line 6 of the electronic device 3 can be centralized onto the body 10 so as to reduce the material cost and the wiring time of the cables as well as provide a neat and good-looking appearance.

In a preferred embodiment of the present invention as shown in FIGS. 2 and 3, the body 10 is composed of a housing 11 and a cover 12, and the housing 11 can accommodate the signal converting unit 15, with the signal converting unit 15 being a signal converter whose signal connecting portion 13 is connected to an electronic device 3 (such as a camera in this embodiment). An end of the housing 11 is extended outward by the signal connecting portion 13, and another end of the housing 11 is provided for extending each first signal line 5 into the housing 11. If the signal connecting portion 13 is connected to the electronic device 3, the signal connecting portion 13 will be able to transmit the first signal received from the electronic device 3 to the signal converting unit 15 through the fourth signal line 8. After the signal converting unit 15 converts the first signal into a signal that can be transmitted by the first signal line 5, the first signal is sent out through the first signal line 5.

In the preferred embodiment, the cover 12 has an opening 121 disposed proximate to an end of the signal connecting portion 13, and another end of the signal connecting portion 13 has at least two holes 122, each being provided for extending at least one third signal line 7 connected to the electric equipment 4 out of the cover 12, and the opening 121 is provided for extending at least one second signal line 6 connected to the electronic device 3 out of the cover 12. The cover 12 covers the relay function wire terminal 14 and wraps around the relay function wire terminal 14, and the relay function wire terminal 14 includes an electric conducting board 143 (such as a circuit board), a plurality of first and second conducting members 141 and 142, and each of the first and second conducting members 141 and 142 is arranged neatly on the electric conducting board 143 and secured onto a surface of the electric conducting board 143 by first and second locking elements 144 and 145, and each first conducting member 141 and its corresponding first locking element 144 are connected to the second signal line 6, and each second conducting member 142 and its corresponding second locking element 145 are connected to the third signal line 7 of the electric equipment 4.

In FIGS. 2 and 3, if the cover 12 is covered onto the housing 11, the second signal line 6 of the camera is extended into the cover 12 through the opening 121 and wound around a first locking element 144 of each first conducting member 141 and connected to the corresponding first conducting member 141, and a connecting line of the electric equipment 4 is extended through each hole 122 into the cover 12 and wound around a second locking element 145 of the second conducting member 142, and connected to the corresponding second conducting member 142, so that the second signal line 6 of the camera can obtain a power supply signal transmitted from the electric equipment 4 by the relay function wire terminal 14, and thus the second signal line 6 of the camera no longer needs a wire to be extended to another power supply source so as to save the material cost and the wiring time of cable. In the meantime, the second signal line 6 of the camera can be centralized to give a neat and good-looking overall appearance. The electric conducting board 143 further includes a light emitting element 146 (such as an LED component) installed between the first and second conducting members 141 and 142 such that when the light emitting element 146 is connected to the electronic device 3 and a connecting line of the electric equipment 4, a light source is emitted to indicate the power supply status.

In the following embodiment given for illustrating the present invention, the signal connecting portion 13 is a BNC connector, and the first, second, and third signal lines 5, 6, 7 are network lines 57, and the first signal line 5 and third signal line 7 are used for forming a network line 57, and the fourth signal line 8 is a coaxial cable. Such an arrangement is used for illustration only, and is not intended to limit the scope of the invention. If a first signal line 5 and a fourth signal line 8 are of different specifications, and a second signal line 6 and a third signal line 7 are of the same specification, these signal lines are known as the first, second, third, and fourth signal lines 5, 6, 7, 8 in the invention. In FIGS. 2 and 3, the signal converting apparatus 1 is connected to another signal converting apparatus 2 by a network line 57, wherein each first conducting member 141 of the other signal converting apparatus 2 and its corresponding first locking element 144 are connected to a connecting line of the electric equipment 4, and the signal connecting portion 13 of the other signal converting apparatus 2 is connected to a digital video recorder. In this embodiment, the network line 57 has at least four connecting lines, wherein two of those connecting lines are connecting lines of the electric equipment 4 connected to each second conducting member 142 and its corresponding second locking element 145 of each signal converting apparatus 1 and 2 respectively, and the other two connecting lines are the first signal lines 5 connected respectively to the signal converting unit 15 of each signal converting apparatus 1 and 2.

After the signal converting unit 15 of the signal converting apparatus 1 converts a first signal in the original format of the coaxial cable into a first signal that can be received by a network line 57, the first signal is transmitted to another signal converting apparatus 2 through the network line 57, and the signal converting unit 15 of the other signal converting apparatus 2 converts the first signal that can be received by the network line 57 into a first signal with the format of the coaxial cable, and transmits the first signal to the digital video recorder through the fourth signal line 8, and finally the first signal is transmitted to a display device 9 (such as a liquid crystal display) for displaying the first signal as an image. With the conversion by each signal converting apparatus 1, 2, the electronic device 3 can obtain the required power supply signal without the need of connecting via separate connecting lines to an electric equipment 4. The present invention can achieve the effects of avoiding many connecting lines from being tangled with each other to maintain a neat and good-looking overall appearance, saving the material cost and the wiring time of the cables, and providing an easy way of removing the cover 12 to give a convenient way of maintaining the body 10.

While the invention has been described by means of specific embodiments, numerous modifications and variations could be made thereto by those skilled in the art without departing from the scope and spirit of the invention set forth in the claims.

What is claimed is:

1. A signal converting apparatus with a relay function connector, comprising:
    a body, including a housing and a cover disposed on a top of the housing to form an accommodating space therebetween, wherein the cover comprises at least one opening disposed proximate to an end thereof and at least two holes disposed proximate to another end thereof;
    a signal converting unit, installed in said accommodating space proximate to a bottom of said housing and having a signal connecting portion disposed at an end thereof, wherein an end of said signal connecting portion is protruded through and out of an end of said housing for connecting to an electronic device and transmitting or receiving a first signal to or from said electronic device, and another end of said signal connecting portion is connected to another signal converting apparatus through at least one first signal line passing through said holes corresponding thereto; and
    a relay function wire terminal installed in said accommodating space and proximate to the top of said housing, and having an end connected to an end of a second signal line and another end connected to an end of a third signal line, wherein another end of said second signal line is passing through said opening corresponding thereto and connected to said electronic device or an electric equipment for transmitting or receiving a second signal to or from said electronic device or said electric equipment, and another end of said third signal line is passing through said holes corresponding thereto and connected to a corresponding end of a relay function wire terminal of said another signal converting apparatus.

2. The signal converting apparatus of claim 1, wherein said relay function wire terminal comprises:
    an electric conducting board;
    a plurality of first conducting members, disposed on said electric conducting board at a position proximate to said end of said signal connecting portion, wherein each of said first conducting member is secured and connected to said second signal line by a first locking element; and
    a plurality of second conducting members, disposed on said electric conducting board at a position away from said end of said signal connecting portion, wherein each of said second conducting member is secured and connected to said third signal line by a second locking element.

3. The signal converting apparatus of claim 2, wherein said electric conducting board further comprises a light emitting element installed between said first and second conducting members for indicating a status of transmitting said second signal between said second signal line and said third signal line.

4. The signal converting apparatus of claim 3, wherein said second signal is a power supply signal transmitted from said electric equipment.

* * * * *